(12) United States Patent
Daffron et al.

(10) Patent No.: US 6,300,805 B1
(45) Date of Patent: Oct. 9, 2001

(54) CIRCUIT FOR AUTO-ZEROING A HIGH IMPEDANCE CMOS CURRENT DRIVER

(75) Inventors: Christopher J. Daffron, Tustin; James M. Aralis, Mission Viejo, both of CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/409,640

(22) Filed: Sep. 30, 1999

(51) Int. Cl.[7] .................................................. H03K 3/00

(52) U.S. Cl. ........................ 327/108; 327/112; 327/437; 330/9

(58) Field of Search .......................... 327/108–112, 170, 327/434, 436, 437, 307; 330/9

(56) References Cited

U.S. PATENT DOCUMENTS 4,518,880 * 5/1985 Masuda et al. ...................... 327/566
5,774,009 * 6/1998 Popper ................................. 327/379

* cited by examiner

*Primary Examiner*—Kenneth B. Wells
(74) *Attorney, Agent, or Firm*—Bret J. Peterson; Frederick J. Telecky, Jr.

(57) ABSTRACT

An improved auto-zeroing circuit for reducing offset currents from high impedance CMOS current drivers. The Auto zero circuit of the present invention contains means to disconnect the output of the current driver from its low impedance load, means to substantially simultaneously connect a capacitor to the output of the current driver, and means to use the output voltage of the current sources during the zeroing mode to adjust the voltage on the capacitor. The capacitor voltage is then used to adjust either of the two output current sources to reduce the offset currents.

17 Claims, 2 Drawing Sheets

CIRCUIT FOR AUTO-ZEROING A HIGH IMPEDANCE CMOS CURRENT DRIVER

CROSS-REFERENCE TO RELATED APPLICATIONS

The following co-assigned and co-filed patent application is incorporated herein by reference:

| Number | Inventors | Title |
| --- | --- | --- |
| 09/410,121 | Daffron, Christopher J. Aralis, James M | A Circuit for Auto-Centering Control Loop Bias Currents |

FIELD OF THE INVENTION

This invention generally relates to CMOS current drivers. More particularly, it relates to a circuit for auto-zeroing a high impedance CMOS current driver.

BACKGROUND OF THE INVENTION

Two important attributes of any high performance current driver are its output impedance and its output offset current. Often the goal is to design a current driver with a high output impedance along with very low offset current. It is fairly straightforward to achieve the first goal through the use of cascoded or resistor de-generated FET devices to create very high output impedance current sources. However, the generation of a high output impedances typically results in the creation of output offset currents due to a mismatch between the D.C. bias currents of the upper and lower current sources that drive the output. The task of reducing TI-28914 this mismatching of currents involves both the careful layout of circuit devices, as well as the use of some additional circuitry to both measure and correct for the offset current. Typical design approaches used to achieve this "zeroing out" of offset currents tend to add a considerable amount of "circuit overhead" relative to the overall current driver topology.

SUMMARY OF THE INVENTION

The present invention introduces a simple and well-integrated method to cancel out offset currents by exploiting the high output impedance nature of CMOS current drivers. The invention uses cascoded or resistor source de-generated FET devices to create two very high impedance current sources. The mismatch between the bias currents is balanced to reduce the offset current using an auto-zeroing circuit.

The auto-zone circuit of the present invention contains three fundamental aspects. The first aspect includes means to disconnect the output of the current driver from its low impedance load. The second aspect includes means to substantially simultaneously connect a capacitor to the output of the current driver. The third aspect includes means to use the output voltage of the current sources during the zeroing mode to adjust the voltage on the capacitor. The capacitor voltage is then used to adjust either of the two output current sources to reduce the offset currents.

An advantage of the present invention is very low circuit overhead to achieve very low offset currents for a high output impedance CMOS current driver.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

The preferred embodiments of the present invention are best understood by referring to FIGS. 1–4 of the drawings, where like numerals are used for like and corresponding parts of the various drawings.

Figure 1:
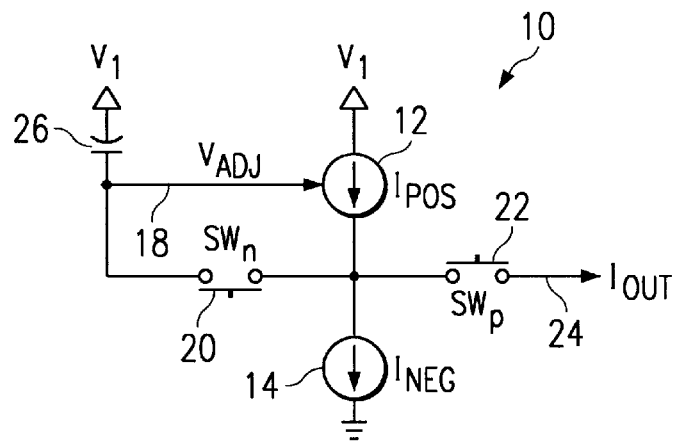
FIG. 1 A basic circuit diagram of an embodiment of the present invention.

FIG. 1 illustrates a basic functional block diagram of a current auto zero circuit 10 according to an embodiment of the present invention. The basic current driver topology includes a top side current source Ipos 12 connected in series with a bottom side current source Ineg 14. The top source Ipos is connected to a reference voltage V1 and includes an adjustment voltage input Vadj 18. The output of Ipos is also connected to a first terminal of switches SWn 20 and SWp 22. Switches SWn and SWp are opposite in phase from each other with SWn open and SWp closed during normal operation. The second terminal of SWp is connected to the circuit output Iout 24. The second terminal of SWn is connected to Vadj and to a capacitor 26. The capacitor stores a voltage that is used to adjust the upper current source's value. The output Iout 24 is typically connected to a low impedance load (not shown).

The auto-zero function of the present invention contains three fundamental aspects. The first aspect is to disconnect the output of the current driver from its low impedance load by opening up switch SWp 22. The second aspect is to simultaneously connect the capacitor directly to the output of the current driver by closing switch SWn 20. The third aspect of the auto-zeroing function (not shown in FIG. 1), is to have a capacitor connected to the gate of a FET device whose drain/source current is largely dependent on its source impedance and whose current is used to adjust either of the two output current sources Ipos or Ineg. The capacitor is charged during the auto-zero mode to the output node voltage. During the closed loop operation of the auto-zero mode, the current that flows through the upper source Ipos must become equalized to the current flowing in the bottom source Ineg. Once the current driver is reconnected to the low impedance load (SWp closed, SWn open) the capacitor retains the current correction voltage, and the output offset current is removed. Due to the current driver's high output impedance, the driver's output current should be highly insensitive to load voltage. The frequency to which the auto-zero function needs to be repeated depends on the leakage current on the capacitor which, to a first order, would depend on the "off" resistance of switch SWn. Although FIG. 1 shows the upper current source as variable and the bottom current source as constant, the inverse relationship is equally as valid.

Figure 2:
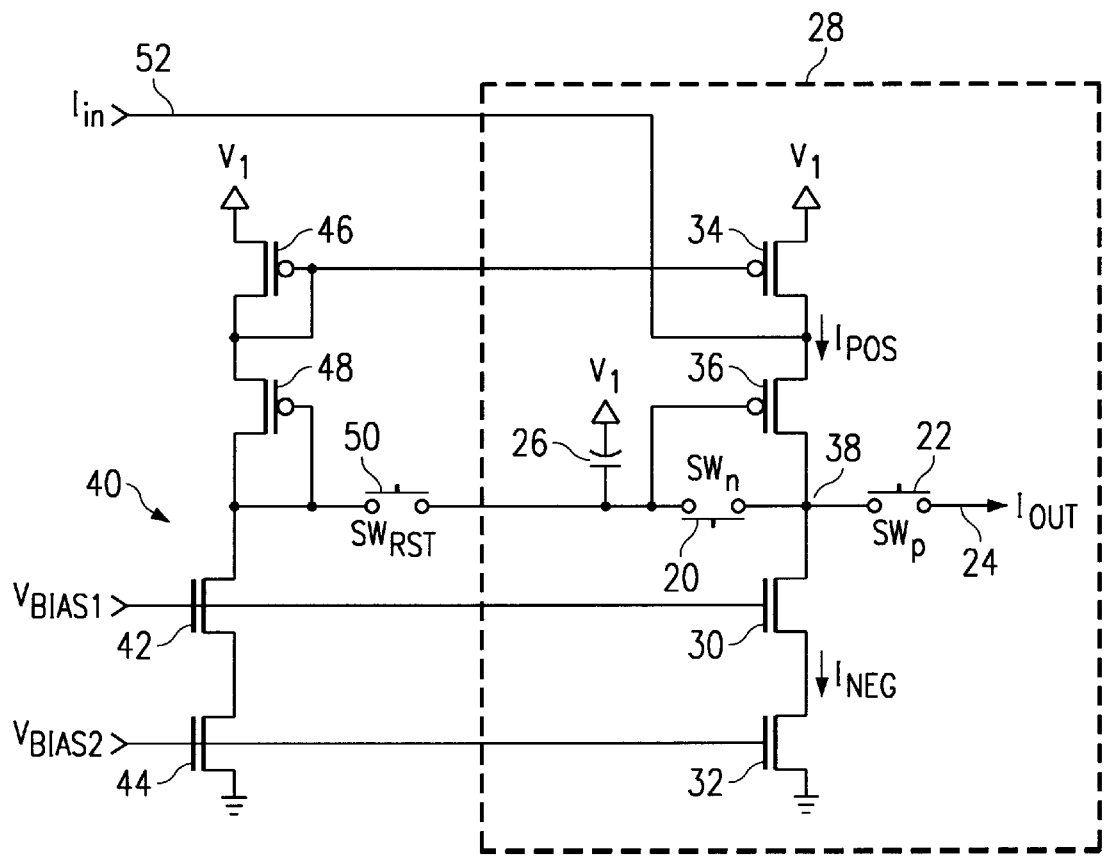
FIG. 2 A direct auto-zeroing circuit according to an embodiment of the present invention.

An embodiment of the present invention is shown in FIG. 2. This circuit implements the current auto-zero function described above. The circuit blocks described in FIG. 1 are primarily represented in the portion of the circuit in the box 28. The bottom current source is composed of cascoded N type FET (NFET) devices 30, 32 whose currents are controlled by the gate biases Vbias1 and Vbias2. The top current source is composed of P type FET (PFET) devices 34, 36 with the top PFET 34 having its source connected to reference voltage V1, and the bottom PFET 36 having its drain connected to the ouput node 38. The gate of the bottom PFET 36 is connected to a capacitor 26 and to the output node through switch SWn 20. The output node 38 is connected through a switch SWp 22 to the circuit output Iout.

The illustrated embodiment of FIG. 2 includes a bias mirror circuit shown generally as 40. The bias mirror circuit 40 includes a lower current source comprising cascoded NFETs 42, 44 with their gates connected to Vbias1 and Vbias2, and an upper current source comprising PFETs 46, 48, PFET 46 has a source tied to V1 and a drain connected to the source of PFET 48. PFET 48 has a drain connected to NFET 42 and to a switch SWrst 50. The PFETs 46, 48 are diode connected. The gate drain connection of the top PFET 46 of the bias mirror circuit provides a bias voltage to the gate of the top PFET 34. The gate drain connection of the bottom PFET 48 of the bias mirror circuit provides a bias voltage that can be set on capacitor 26 through switch SWrst 50 during the reset operation described below.

The preferable operation of the circuit of FIG. 2 is as follows. Initially the circuit starts up with SWn 20 open, and both SWp 22 and SWrst 50 closed. The difference between the currents Ipos and Ineg would be mostly due to device mismatches in both the bottom cascode current sources and the cascoded current mirror. Once the capacitor is initially charged, the switch SWrst would then open up and remain open throughout the rest of the current driver operation, including auto-zeroing.

During the auto-zeroing mode, SWn closes while SWp opens. This configuration connects both the capacitor and the gate of the lower PFET 36 in the upper current source to the high impedance output node. Since the current in the upper source can now only flow into the bottom source, the two currents will now be equal. Concurrently, the voltage at the output node 38 will settle to a value such that the voltage across the output impedances of each current source produces equal currents. Since the upper current source is no longer in the cascode configuration, its output impedance is reduced to the impedance of the top PFET 34 device. This output impedance will control the closed loop gain and hence the amount of voltage swing on the output node during auto-zeroing. The resulting gate voltage is stored on the capacitor.

When the output node of the current driver is reconnected to its load, the upper current source reverts back to a cascode and the gate voltage of the bottom PFET 36 is retained on the capacitor. Although the output node voltage varies between normal and auto-zero modes, the resulting offset current from this difference is negligible due to the exceedingly high output impedance of the double cascoded current driver. The voltage on the capacitor 26 now adjusts the gain of PFET 36 to compensate for offset currents. An input current 52 can be injected between the PFET devices 34, 36 to drive the output current Iout which has a desirable high input impedance and low offset current.

The simple topology of the circuit of FIG. 2 has some limitations. The impedance of the device that controls the closed loop current gain also directly controls the main bias current of the upper source. Therefore, the closed loop current gain relative to the value of the D.C. bias current of the driver cannot be independently adjusted. A second limitation is the amount to which the gate voltage on the bottom PFET 36 device can vary relative to the voltage on the output node. If the offset current correction requires the gate voltage of the bottom PFET 36 device to drop below the output voltage enough to bring the device out of saturation, then the output impedance of the current driver would be reduced sharply.

Figure 3:
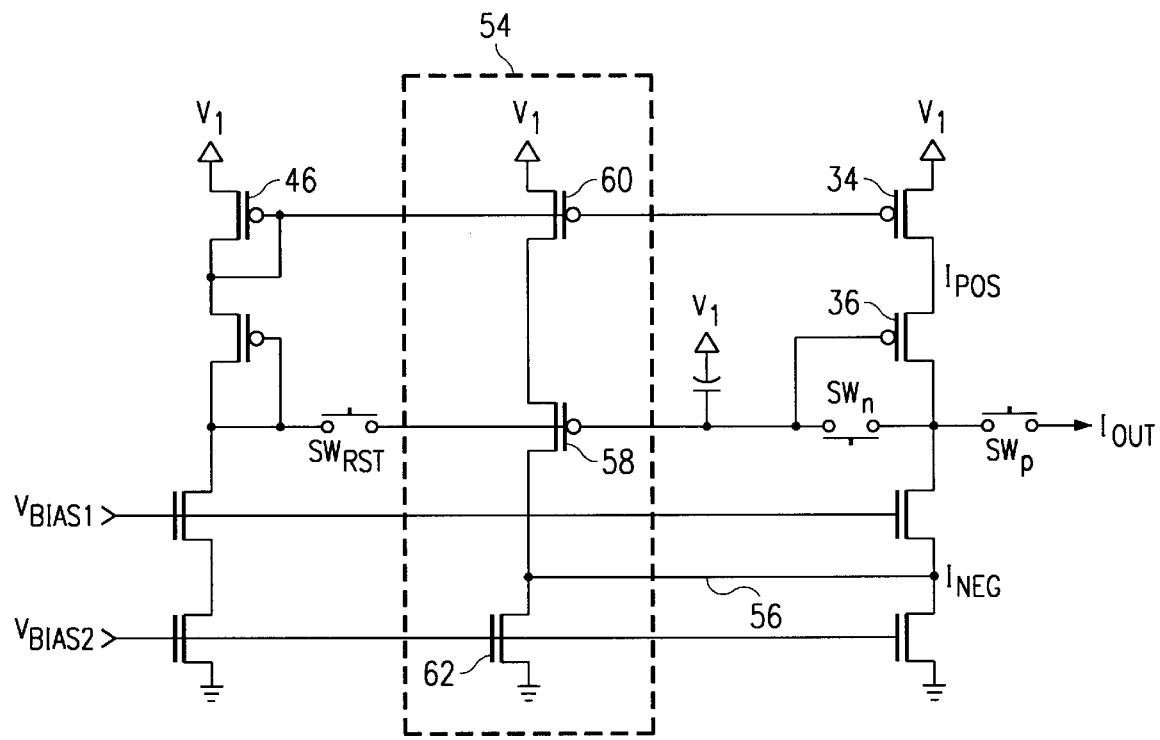
FIG. 3 An indirect auto-zeroing circuit according to an embodiment of the present invention.

Another embodiment shown in FIG. 3 introduces a modification to the above design to address both of these limitations. As shown in FIG. 3, a less direct method of injecting correction current into the output current sources is used. A new separate indirect current source 54 is constructed with its output wired to the bottom current source at node 56 in a folded cascode configuration. In this configuration, the capacitor is connected to the gate of a FET of the indirect current source 54. In the illustrated embodiment, the capacitor is connected to the gate of PFET 58 and to the reset switch 50. The indirect current source 54 also includes a second PFET 60, whose drain is connected to the source of PFET 58 and its gate connected to the gates of the other two top PFETs 34, 46. Further, the indirect current source 54 has an NFET 62 connected source to drain with PFET 58 and with its gate connected to Vbias2.

In the embodiment of FIG. 3, during the auto-zeroing mode, the closed loop current gain is controlled by the impedance of the new current source. Additionally, the gate voltage swing on the new top PFET device is not limited by the output node voltage. The only drawbacks of this method are additional devices, as well as, additional offset current correction due to the offset current of the new current source itself.

Figure 4:
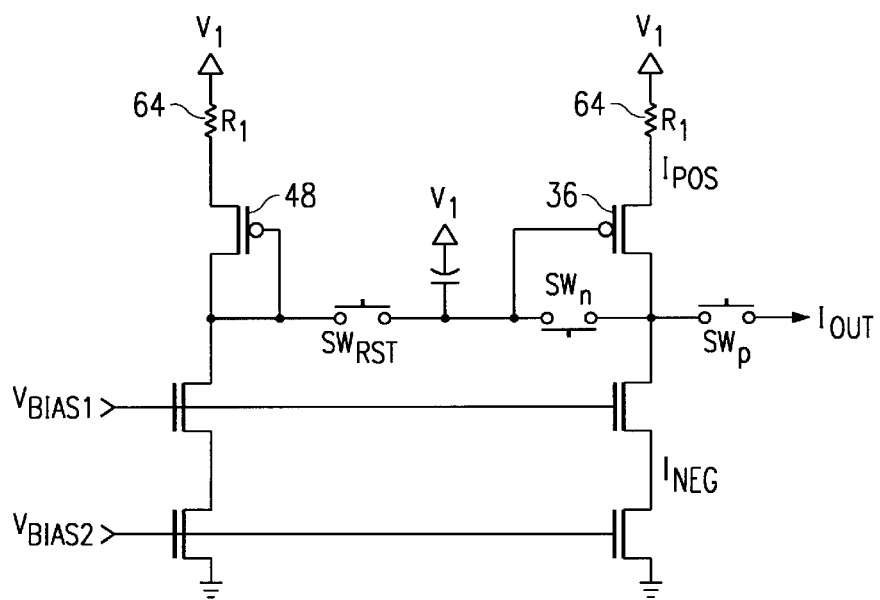
FIG. 4 A direct auto-zeroing circuit using source de-generated current sources according to an embodiment of the present invention.

FIG. 4 illustrates another embodiment of the present invention that uses source de-generated current sources. This embodiment is essentially the same as the embodiment described with reference to FIG. 2 except the PFET current sources 34, 46 of FIG. 3 has been replaced with source de-generated current sources. Each of the PFET current sources has a resistor R1 64 connected to the source of the PFET 36, 48. This embodiment would typically have lower output impedance but could be appropriate for some applications.

Finally, it is noted that FETs, combined with source degenerating resistors, could have replaced all of the cascoded current sources, shown in the figures, and all aspects of the invention would still apply. Further, the illustrated embodiments do not show the control circuitry that would control the switches for the reset and auto-zeroing operations. It is contemplated that this functionality and structure is easily within the ability and knowledge of those skilled in this art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current driver circuit comprising:
   a first and a second current source connected in series at a common node;
   a first switch which operates to connect the common node to an output;

a second switch which operates to connect a first terminal of a capacitor to the common node; and wherein an input to one of the current sources is connected to the first terminal of the capacitor to adjust the current source current with a voltage on the capacitor and wherein at least one of the first and second current sources comprises two cascoded PFET devices.

2. The current driver circuit according to claim 1, wherein the first current source comprises two PFET devices and the second current source comprises two NFET devices.

3. The current driver circuit according to claim 2, wherein the input to the current source that is connected to the first terminal of the capacitor is the gate of a lower PFET device in the current source, and wherein the lower PFET device has a drain connected to the source of a top one of two NFET devices.

4. The current driver circuit according to claim 1, wherein at least one of the first and second current sources comprises a source de-generated PFET device.

5. A current driver circuit comprising:

a first current source comprising at least one P type FET each having a gate;

a second current source comprising at least one N type FET each having a gate, the second current source connected to the first current source at a common node;

a switch operable to connect the common node to a circuit output;

a second switch operable to connect a first terminal of a capacitor to the common node when the first switch is open; and circuitry for using the voltage of the capacitor to adjust one of the current source currents and wherein at least one of the first and second current sources comprises two cascoded PFET devices.

6. The current driver circuit according to claim 5, wherein at least one of the first and second current sources comprises a source de-generated PFET device.

7. The current driver of claim 6 wherein the circuitry for using the voltage of the capacitor to adjust one of the current source currents is a direct connection from the capacitor to one of the gates of the FET devices.

8. The current driver of claim 6 wherein the circuitry for using the voltage of the capacitor to adjust one of the current source currents is a current mirror to fold a current into the first or second current source.

9. The current driver of claim 6 further comprising a bias current mirror circuit to provide a bias current to at least one gate of one of the FETs.

10. The current driver of claim 6 further comprising a bias current mirror circuit to provide a bias current to at least one gate of one FET device, wherein the bias current mirror circuit comprises two NFET devices and two PFET devices.

11. The current driver of claim 8 wherein the adjust circuit for using the voltage of the capacitor to adjust one of the current source currents is a direct connection from the capacitor to one of the gates of the FET devices.

12. The current driver of claim 8 wherein the adjust circuit for using the voltage of the capacitor to adjust one of the current source currents is a current mirror to fold a current into the first or second current source.

13. The current driver of claim 9 wherein the bias current mirror circuit comprises two NFET devices, two PFET devices, and a reset switch to connect an initial voltage to the capacitor.

14. The current driver of claim 10 wherein the bias current mirror circuit comprises two NFET devices, two PFET devices, and a reset switch to connect an initial voltage to the capacitor.

15. The current driver of claim 12 further comprising means for operating the switches to open the first switch and close the second to adjust the voltage on the capacitor to the voltage on the output node.

16. A high impedance output CMOS current driver circuit comprising:

a first current source comprising two P type FETs connected drain to source each having a gate;

a second current source comprising two N type FETs connected drain to source each having a gate, the second current source connected to the first current source at a common node;

a switch which operates to connect the common node to a circuit input/output;

a second switch which operates to connect a first terminal of a capacitor to the common node;

an adjust circuit for using the voltage of the capacitor to adjust one of the current source currents; and a bias current mirror circuit to provide a bias current to at least one gate of one FET device.

17. The current driver of claim 16 further comprising means for operating the switches to open the first switch and close the second to make the voltage on the capacitor equal the voltage on the output node.

* * * * *